(12) United States Patent
Peng

(10) Patent No.: US 12,724,046 B2
(45) Date of Patent: Sep. 1, 2026

(54) ENERGY MEASUREMENT DEVICE

(71) Applicant: Chicony Power Technology Co., Ltd., New Taipei City (TW)

(72) Inventor: Wei-Hsuan Peng, New Taipei City (TW)

(73) Assignee: Chicony Power Technology Co., Ltd., New Taipei City (TW)

( * ) Notice: Subject to any disclaimer, the term of this patent is extended or adjusted under 35 U.S.C. 154(b) by 198 days.

(21) Appl. No.: 18/665,598

(22) Filed: May 16, 2024

(65) Prior Publication Data

US 2025/0277831 A1 Sep. 4, 2025

(30) Foreign Application Priority Data

Mar. 1, 2024 (TW) ................................ 113107598

(51) Int. Cl.
*G01R 22/10* (2006.01)
*G01R 19/25* (2006.01)

(52) U.S. Cl.
CPC ......... *G01R 22/10* (2013.01); *G01R 19/2506* (2013.01); *G01R 19/2513* (2013.01)

(58) Field of Classification Search
CPC G01R 22/10; G01R 19/2506; G01R 19/2513; G01R 19/00
See application file for complete search history.

(56) References Cited

U.S. PATENT DOCUMENTS 6,397,361 B1 5/2002 Saitoh
8,380,463 B2 * 2/2013 Philipps ................. G01D 21/02 702/57
11,169,223 B2 * 11/2021 Ostermann ............ G01R 33/07
11,605,974 B2 * 3/2023 Coats ................... G01R 15/142
12,345,746 B2 * 7/2025 Liu .................... G01R 19/2513
2010/0106449 A1 * 4/2010 Kalb ...................... G01D 21/02 702/118
2016/0139208 A1 * 5/2016 Tsuruta ................ G01R 31/371 324/426
2017/0356939 A1 * 12/2017 Hurwitz ............... G01R 25/005
(Continued)

FOREIGN PATENT DOCUMENTS

CN 114264386 A 4/2022
CN 115307764 A 11/2022
(Continued)

*Primary Examiner* — Giovanni Astacio-Oquendo
(74) *Attorney, Agent, or Firm* — CKC & Partners Co., LLC

(57) ABSTRACT

An energy measurement device comprising a conversion circuit and a first measurement circuit. The conversion circuit is coupled to a sensor through an input port of the energy measurement device to receive a sensing voltage. The conversion circuit is configured to convert the sensing voltage into a preset measurement signal, and provide the preset measurement signal to the processing circuit. The first measurement circuit is coupled to a processing circuit through the conversion circuit, and is coupled to the sensor through the input port. The first measurement circuit comprises a first switch, when the first switch receives a first enable signal provided by the processing circuit, the first measurement circuit is configured to convert the sensing voltage into a first measurement voltage, and the conversion circuit is configured to convert the first measurement voltage into a first measurement signal.

19 Claims, 6 Drawing Sheets

(56) References Cited

U.S. PATENT DOCUMENTS

| | | | | |
|---|---|---|---|---|
| 2018/0287625 | A1* | 10/2018 | Murashima | H03M 1/1076 |
| 2019/0293695 | A1* | 9/2019 | Guthrie | H02M 3/156 |
| 2022/0345126 | A1 | 10/2022 | Harriman et al. | |
| 2024/0019315 | A1 | 1/2024 | Rothmund et al. | |

FOREIGN PATENT DOCUMENTS

| | | | |
|---|---|---|---|
| CN | 115931024 | A | 4/2023 |
| CN | 220508268 | U | 2/2024 |
| TW | 201205493 | A | 2/2012 |
| TW | I738556 | B | 9/2021 |
| TW | 202332919 | A | 8/2023 |
| TW | 202338678 | A | 10/2023 |

* cited by examiner

ENERGY MEASUREMENT DEVICE

CROSS-REFERENCE TO RELATED APPLICATION

This application claims priority to Taiwan Application Serial Number 113107598, filed Mar. 1, 2024, which is herein incorporated by reference in its entirety.

BACKGROUND

Technical Field

The present disclosure relates to energy measurement technology, and in particular to an energy measurement device.

Description of Related Art

With the increasingly severe issue of global warming and the accelerated depletion of energy resources, "energy conservation and carbon reduction" has become an issue that has received more and more attention in recent years. From the government to businesses, efforts have been devoted to developing green energy to create a sustainable low-carbon society and economy.

To achieve energy conservation and carbon reduction, in order to know how to improve energy consumption problems, it is essential to have a clear understanding of the historical records of energy consumption in order to identify how to improve energy efficiency issues. Therefore, designing an energy measurement device that can be applied to different energy-consuming equipment and environments has become a major current challenge.

SUMMARY

One aspect of the present disclosure is an energy measurement device, comprising a conversion circuit and a first measurement circuit. The conversion circuit is coupled to a processing circuit, and is coupled to a sensor through an input port of the energy measurement device to receive a sensing voltage. The conversion circuit is configured to convert the sensing voltage into a preset measurement signal, and provide the preset measurement signal to the processing circuit. The first measurement circuit is coupled to the processing circuit through the conversion circuit, and is coupled to the sensor through the input port. The first measurement circuit comprises a first switch, when the first switch receives a first enable signal provided by the processing circuit, the first measurement circuit is configured to convert the sensing voltage into a first measurement voltage, and the conversion circuit is configured to convert the first measurement voltage into a first measurement signal.

Another aspect of the present disclosure is an energy measurement device, comprising a processing circuit, a conversion circuit and a first measurement circuit. The conversion circuit is coupled to the processing circuit, and is coupled to a sensor through an input port of the energy measurement device to receive a sensing voltage. The first measurement circuit is coupled to the processing circuit through the conversion circuit, and is coupled to the sensor through the input port. When the processing circuit disables the first measurement circuit, the conversion circuit is configured to convert the sensing voltage into a preset measurement signal, and provide the preset measurement signal to the processing circuit. When the processing circuit enables the first measurement circuit, the first measurement circuit is configured to convert the sensing voltage into a first measurement voltage, and the conversion circuit is configured to convert the first measurement voltage into a first measurement signal.

Another aspect of the present disclosure is an energy measurement device, comprising a processor, a plurality of input ports and a plurality of energy measurement circuits. The plurality of input ports is coupled to a plurality of sensors. Each of the plurality of energy measurement circuits is respectively coupled to one of the plurality of input ports, and comprises a conversion circuit and a first measurement. The conversion circuit is coupled to the processor, and is coupled to a corresponding one of the plurality of input ports to receive a sensing voltage of a corresponding one of the plurality of sensors. When the sensing voltage is within a preset voltage range, the conversion circuit is configured to convert the sensing voltage into a preset measurement signal. The first measurement circuit is coupled to the processor through the conversion circuit, and is coupled to the corresponding one of the plurality of input ports. When the sensing voltage is within a first voltage range, the first measurement circuit is enabled by the processor, and is configured to convert the sensing voltage into a first measurement voltage. The conversion circuit is configured to convert the first measurement voltage into a first measurement signal.

It is to be understood that both the foregoing general description and the following detailed description are by examples, and are intended to provide further explanation of the disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

For the embodiment below is described in detail with the accompanying drawings, embodiments are not provided to limit the scope of the present disclosure. Moreover, the operation of the described structure is not for limiting the order of implementation. Any device with equivalent functions that is produced from a structure formed by a recombination of elements is all covered by the scope of the present disclosure. Drawings are for the purpose of illustration only, and not plotted in accordance with the original size.

It will be understood that when an element is referred to as being "connected to" or "coupled to", it can be directly connected or coupled to the other element or intervening elements may be present. In contrast, when an element to another element is referred to as being "directly connected" or "directly coupled," there are no intervening elements present. As used herein, the term "and/or" includes an associated listed items or any and all combinations of more.

The represent disclosure relates to an energy measurement device, which can be applied to various load devices. The energy measurement device is coupled to a sensor arranged on a load device to receive and record an energy consumption data of the load device. Depending on the type of the load device, the information categories that present the energy consumption data may also be different. For example, when detecting one load device, the sensor records "voltage" of the load device to present the current energy consumption status. When detecting another load device, the sensor records "current" of the load device to present the current energy consumption status. In other words, sensor can output different types of energy consumption data.

In one embodiment, different types of energy consumption data must be recorded by specific energy measurement devices, or received through specific receiving ports. For example, for a sensor that outputs "voltage", the energy measurement device needs to receive it through a specific voltage receiving port, and for a sensor that outputs "current", the energy measurement device needs to receive it through a specific current receiving port. Therefore, the arrangement of conventional energy measurement devices is relatively inconvenient and has high arrangement costs.

In other embodiments, conventional energy measurement device is equipped with a switch, and user can control the switch according to different types of the energy consumption data to select different receiving circuits in the energy measurement device to receive signals. However, this method still requires manual operation by the user, so it is not perfect in use.

Figure 1:
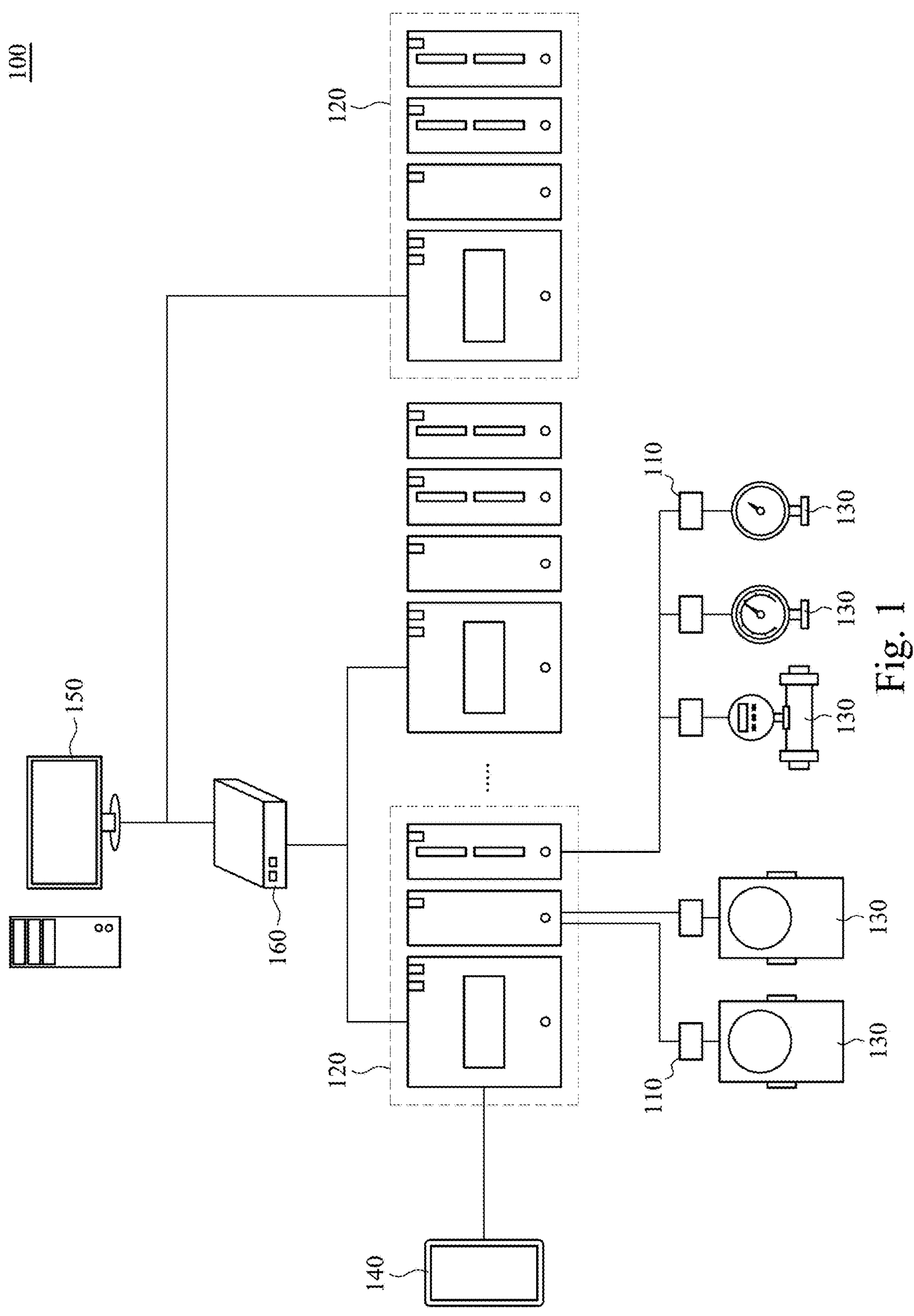
FIG. 1 is a schematic diagram of an energy management system in some embodiments of the present disclosure.

FIG. 1 is a schematic diagram of an energy management system in some embodiments of the present disclosure. The energy management system 100 includes multiple sensors 110 and multiple energy measurement devices 120. Each of sensors 110 is respectively arranged on a load device 130 to obtain/capture electrical data (e.g., voltage, current) of the load device 130 and generates a sensing signal.

The energy measurement device 120 is coupled to one or multiple sensors 110 to receive a sensing signal provided by the sensors 110. Due to sensing signals being transmitted to the energy measurement device 120 in the form of electrical signal, and since voltage and current are two sides of the same electrical signal, the sensing signal(s) provided by the sensors 110 is referred to "sensing voltage" herein.

In one embodiment, the energy management system 100 further includes a control device 140, a management server 150 and a network equipment 160. The control device 140 can be a portable device (e.g., smart phone) that is communicatively connected to the energy measurement device 120 to manage the energy measurement device 120 (e.g., check data, set detection parameters). The management server 150 establishes a communication connection with the energy measurement device 120 in a wired or wireless manner to receive all data obtained by the energy measurement device 120 and integrate it into energy consumption records for users to check at any time. As shown in the figure, the energy measurement device 120 may be indirectly connected to the management server 150 through the network equipment 160, or directly connected to the management server 150. Since people in the art can understand the method of transmitting information between devices through communication technology, and thus they are not further detailed herein.

Figure 2:
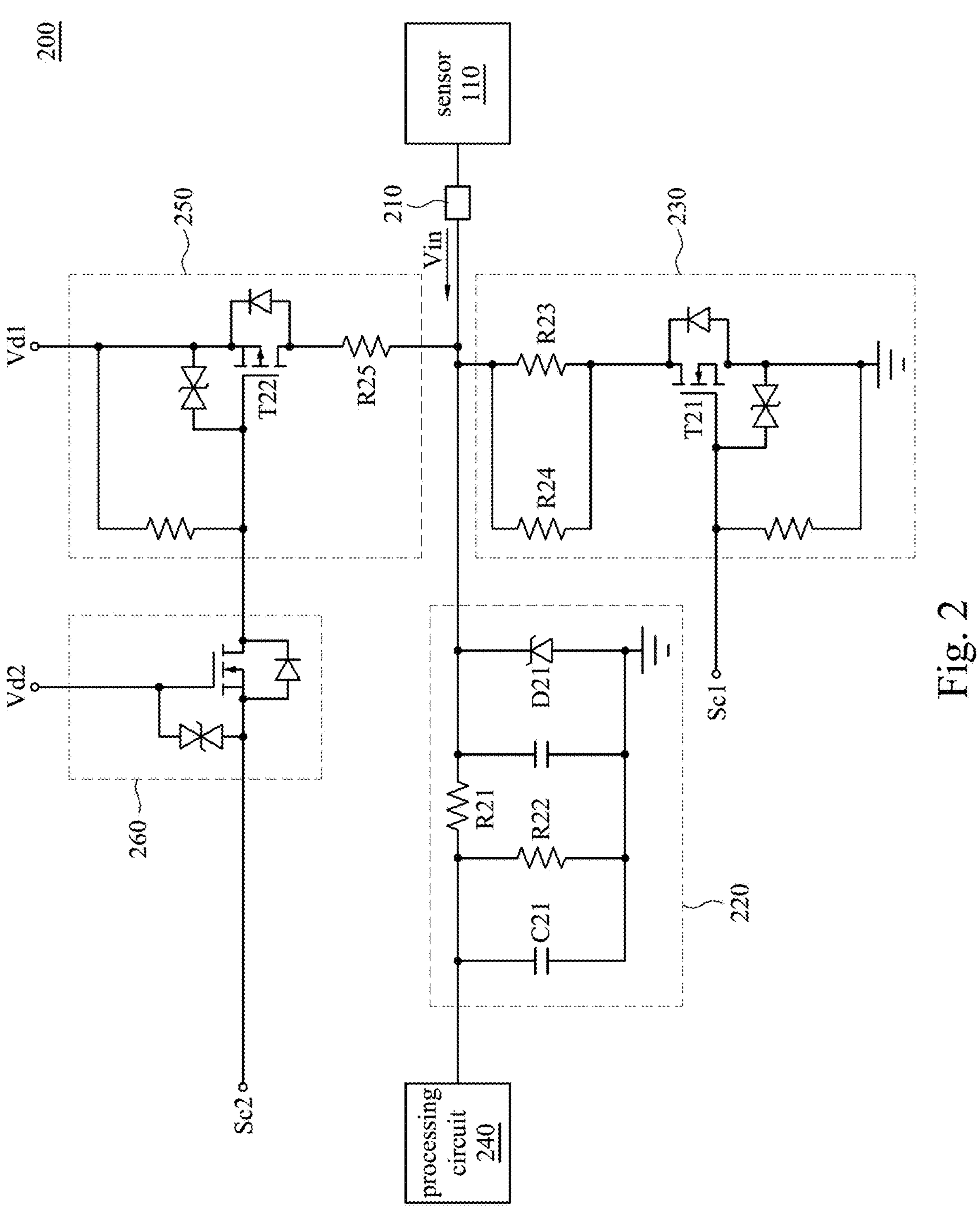
FIG. 2 is a schematic diagram of an energy measurement device in some embodiments of the present disclosure.

FIG. 2 is a schematic diagram of an energy measurement device in some embodiments of the present disclosure, which can be applied to implement one of the energy measurement devices 120 shown in FIG. 1. In one embodiment, the energy measurement device 200 at least includes a input port 210, a conversion circuit 220, a first measurement circuit 230 and a processing circuit 240.

Referring to FIG. 1 and FIG. 2, the input port 210 is coupled to the sensor 110 to receive a sensing voltage Vin from the sensor 110. In order to make the diagram concise, the input port 210 is represented by "node" here. It should be mentioned here that although only one input port 210 is shown in FIG. 2, in other embodiments, the energy measurement device 200 may include multiple input ports 210, and each of input ports 210 is configured to be coupled to a different sensor 110. In addition, each input port 210 corresponds to a circuit structure shown in FIG. 2 to receive the sensing voltage Vin provided by the corresponding sensor 110 respectively. The connection specifications of the input port 210 can be changed according to the actual specifications of the sensor 110. Since people in the art can understand the implementation of input ports 210, and thus they are not further detailed herein.

The input terminal of the conversion circuit 220 is coupled to the sensor 110 through the corresponding input port 210 to receive the sensing voltage Vin provided by the sensor 110. The output terminal of the conversion circuit 220 is coupled to the processing circuit 240. As shown in FIG. 2, the conversion circuit 220 is coupled between the input port 210 and the processing circuit 240, and is configured to convert the sensing voltage Vin into a preset measurement signal, and provide the preset measurement signal to the processing circuit 240.

In one embodiment, the conversion circuit 220 includes a voltage divider circuit and a filter circuit, and is configured to divide and filter the sensing voltage Vin, so that the converted preset measurement signal is within a preset measurement range. In some embodiments, when the sensing voltage Vin is within the preset voltage range, the energy measurement device 200 chooses to use the conversion circuit 220 to convert the sensing voltage Vin. For example, the conversion circuit 220 is configured to receive and convert the sensing voltage Vin of an industrial motor, when the industrial motor operating, the sensing voltage Vin detected by the sensor 110 will be between "10-20 volts" (i.e., a preset voltage range), and the preset measurement signal generated by the conversion circuit 220 will be between "3-6 volts" (i.e., a preset measurement range). Multiple methods for the energy measurement device 200 to receive different signals by selecting different circuits will be explained in subsequent paragraphs.

Specifically, the conversion circuit 220 includes a voltage limiting element D21, multiple voltage dividing resistors R21-R22 and a filter capacitor C21 to implement the voltage divider circuit and the filter circuit. The voltage limiting element D21 is coupled to the input port 210, and is configured to stabilize the voltage of the input terminal of the conversion circuit 220. The voltage limiting element D21 can be realized by a Zener diode.

The voltage dividing resistors R21-R22 are coupled to the voltage limiting element D21, and are configured to divides the sensing voltage Vin. In one embodiment, the voltage dividing resistor R21 is coupled between the input port 210 and the processing circuit 240. The voltage dividing resistor R22 is coupled between the voltage dividing resistors R21 and a reference potential (e.g., groung). The filter capacitor C21 is coupled between the voltage dividing resistors R21-R22 and the processing circuit 240, and is configured to filter out noise in the voltage.

The first measurement circuit 230 is coupled to the sensor 110 through the input port 210, and is coupled to the processing circuit 240 through the conversion circuit 220. The processing circuit 240 is configured to selectively enable or disable the first measurement circuit 230, so that the sensing voltage Vin is converted into different measurement signals by different circuits.

In one embodiment, the first measurement circuit 230 includes a first switch T21. The turned-on or turned-off state of the first switch T21 is controlled by a control signal Sc1 provided by the processing circuit 240. For example, when the processing circuit 240 transmits a first enable signal to a control terminal of the first switch T21, the first switch T21 will be in a turned-on state. When the processing circuit 240 transmits a first disable signal to the control terminal of the first switch T21, the first switch T21 will be in the turned-off state, and the first measurement circuit 230 will become open. In one embodiment, the first switch T21 can be implemented by an N-type or P-type Metal-Oxide-Semiconductor Field-Effect Transistor (MOSFET), but in some other embodiments, it can also be implemented by other transistor switches or switching elements.

As shown in FIG. 2, when the processing circuit 240 disables the first measurement circuit 230, since the first measurement circuit 230 becomes open (switched to open circuit), the first measurement circuit 230 will not perform any processing on the sensing voltage Vin. At this time, the conversion circuit 220 will directly receive the sensing voltage Vin and convert the sensing voltage Vin into the preset measurement signal.

On the other hand, when the processing circuit 240 enables the first measurement circuit 230, the first measurement circuit 230 can operate normally. Since the first measurement circuit 230 is coupled between the input port 210 and the conversion circuit 220, the sensing voltage Vin first will be converted into the first measurement voltage by the first measurement circuit 230. Then, the conversion circuit 220 converts the first measurement voltage (instead of the original sensing voltage Vin) to generate a first measurement signal.

Accordingly, by selectively enabling or disabling the first measurement circuit 230, the energy measurement device 200 can convert the sensing voltage Vin by different circuits or circuit combinations according to different sensing conditions. For example, in the case that the load device 130 coupled to the input port 210 and the sensor 110 is an industrial motor, the energy measurement device 200 converts the sensing voltage Vin by the conversion circuit 220 to correctly interpret the current energy consumption of the industrial motor. In the case that the load device 130 coupled to the input port 210 and the sensor 110 is an industrial water pump, the energy measurement device 200 converts the sensing voltage Vin by the by the conversion circuit 220 and the first measurement circuit 230 to correctly interpret the current energy consumption of the industrial water pump.

Figure 3:
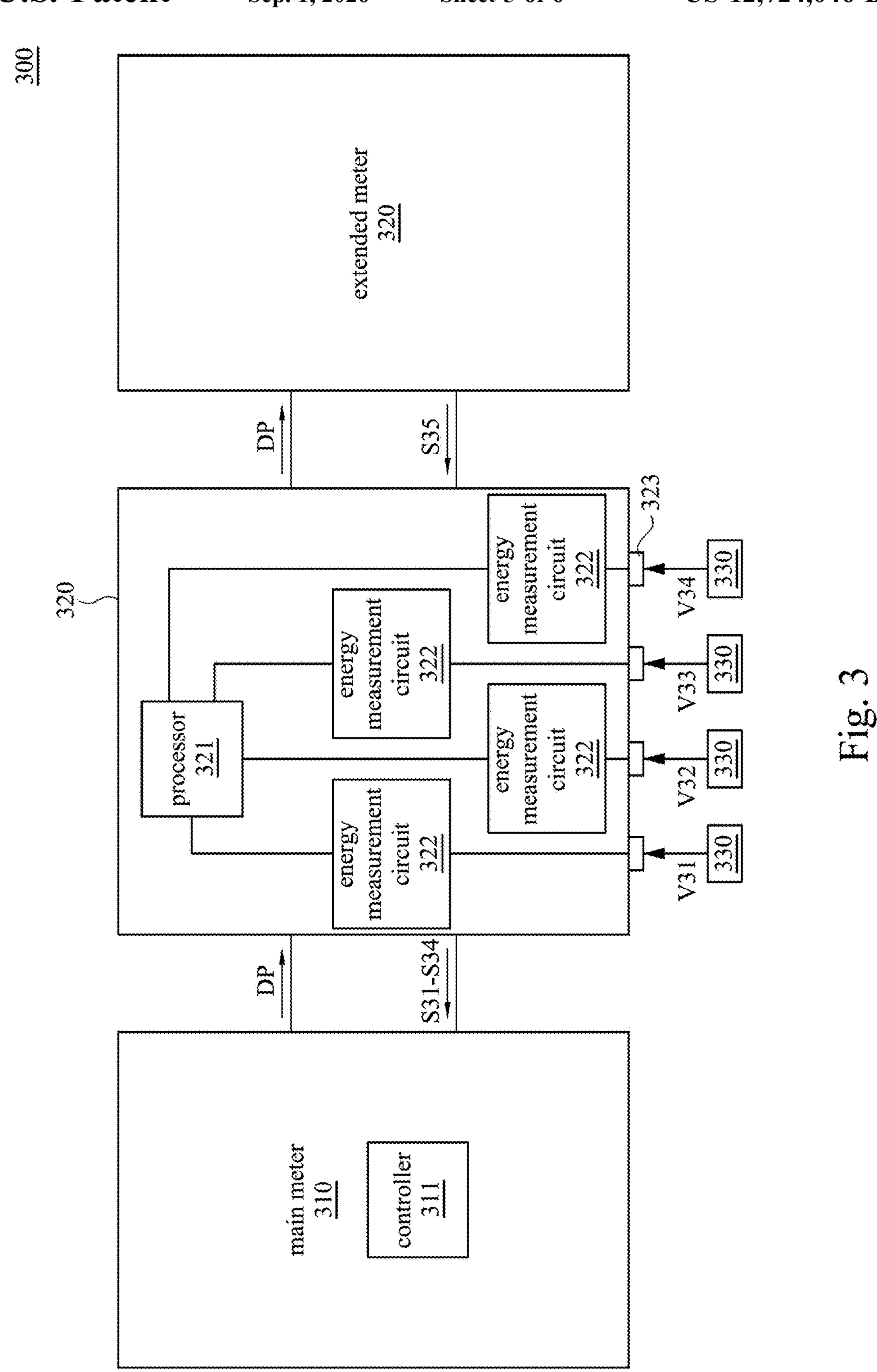
FIG. 3 is a functional block diagram of the energy measurement device in some embodiments of the present disclosure.

To facilitate understanding the application and effectiveness of the energy measurement device of the represent disclosure, an explanation is provided herein using FIG. 3 as an example. FIG. 3 is a functional block diagram of an energy measurement device 300 in some embodiments of the present disclosure, which can be implemented the energy measurement device 120 shown in FIG. 1, and the energy measurement device 200 shown in FIG. 2 can be implemented as a part of the energy measurement device 300.

As shown in FIG. 3, the energy measurement device 300 includes a main meter 310 and one or multiple extended meters 320. The main meter 310 includes a controller 311, and is coupled to the extended meter(s) 320. The extended meter 320 includes a processor 321, multiple energy measurement circuits 322 and multiple input ports 323. Each of the input ports 323 respectively corresponds and is coupled to a different energy measurement circuit 322, and each of the energy measurement circuits 322 respectively corresponds to a different sensor 330. The energy measurement circuit 322 can be implemented by the conversion circuit 220, the first measurement circuit 230 and the second measurement circuit 250 shown in FIG. 2.

In one embodiment, the processor 321 can be the processing circuit 240 shown in FIG. 2. In other words, the processor 321 (the processing circuit 240) is configured to receive measurement voltages V31-V34 transmitted by different energy measurement circuits 322. In some other embodiments, the operation performed by the processing circuit 240 shown in FIG. 2 can be implemented by the controller 311 and the processor 321 shown in FIG. 3.

In one embodiment, the extended meter 320 is coupled to multiple sensors 330 through multiple input ports 323, and each sensor 330 is further coupled to the different load device (not shown in FIG. 3). The extended meter 320 interpret the received measurement voltages V31-V34 through the energy measurement circuit 322 as multiple measurement signals S31-S34, and provides the measurement signals S31-S34 to the main meter 310. In addition, the main meter 310 is configured to provide driving power DP to the extended meter 320, so that the extended meter 320 obtains the driving power DP for operation.

In one embodiment, multiple extended meters 320 are connected in series with each other. Therefore, the driving power DP provided by the main meter 310 will first pass through the first extended meter 320 and then be provided to the second extended meter 320. Similarly, the measurement signal S35 obtained by the second extended meter 320 will first pass through the first extended meter 320 and then be transmitted to the main meter 310.

As mentioned above, the energy measurement device 120/200/300 includes the conversion circuit and one or more measurement circuits, and can receive and convert the sensing voltage Vin by different circuit combinations to correctly interpret the measurement signal. In other words, for different load devices, the conversion circuit and the measurement signal generated by each measurement circuit will correspond to different measurement ranges.

Figure 4A:
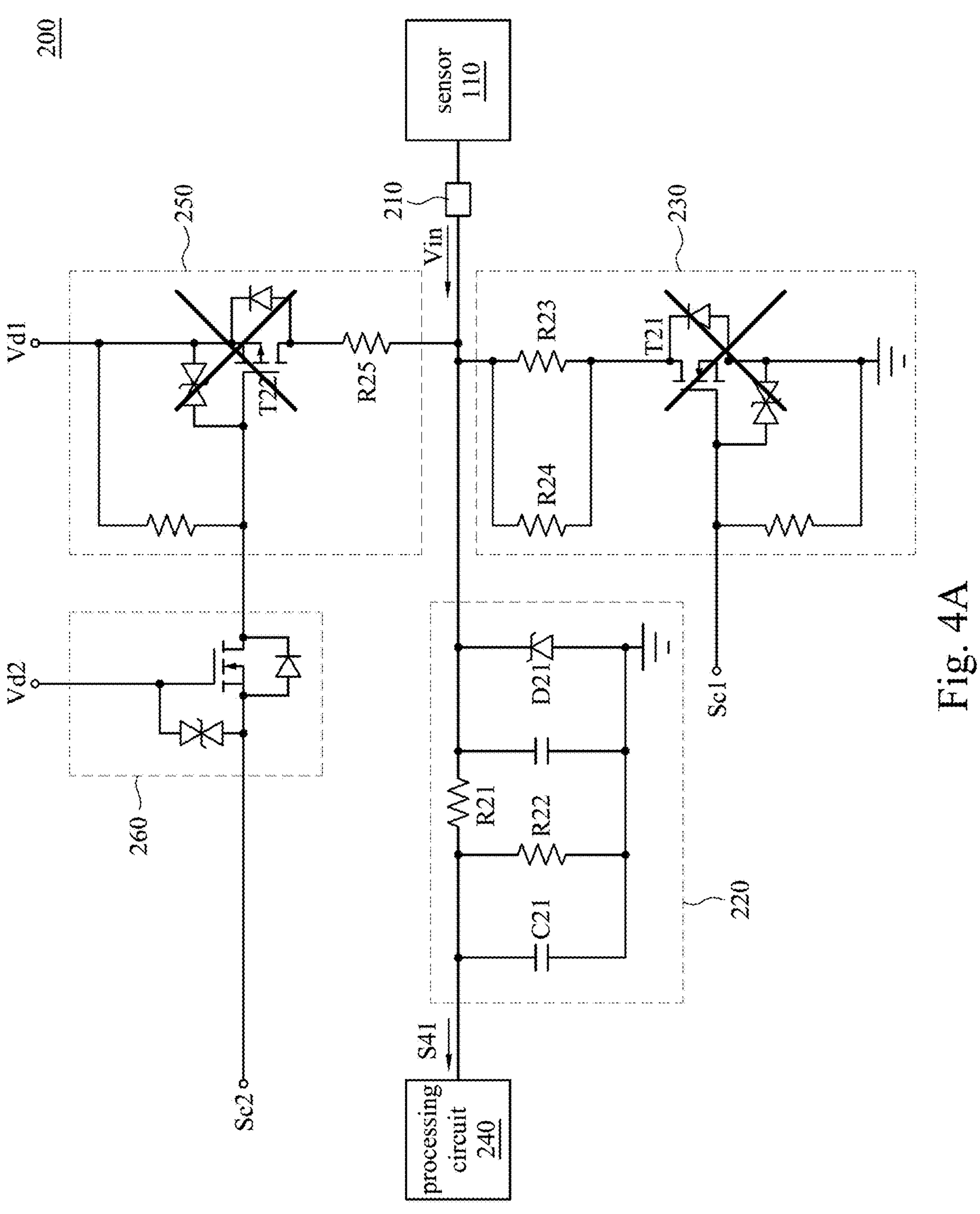
FIGS. 4A-4C are schematic diagrams of the operations of the energy measurement device in some embodiments of the present disclosure.
Figure 4B:
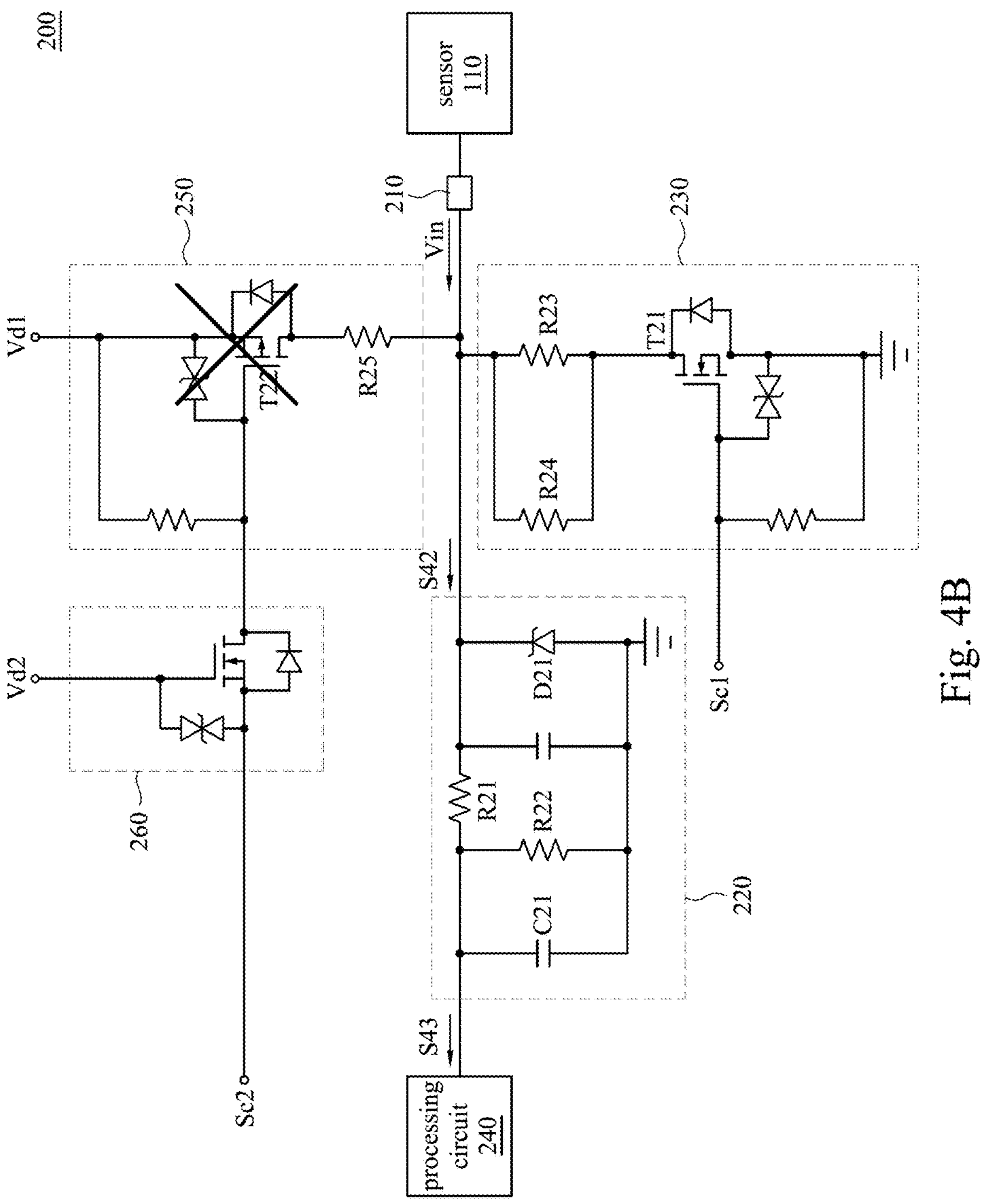
Figure 4C:
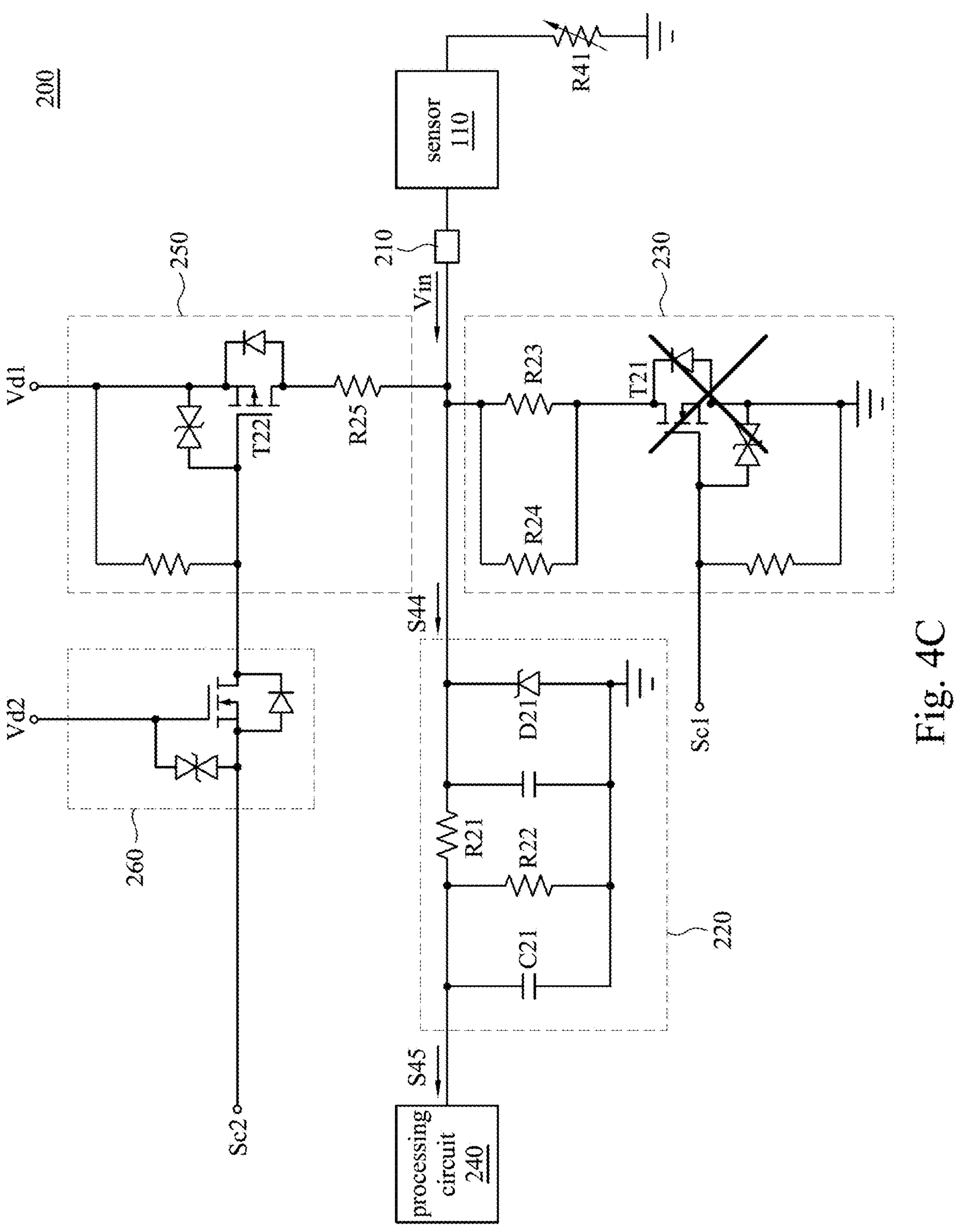

FIG. 4A-4C are schematic diagrams of the operations of the energy measurement device in some embodiments of the present disclosure. Here, the circuit architecture of the energy measurement device 200 is used to describe the circuit details and operation. As mentioned before, since voltage and current are two sides of an electrical signal, the circuit itself cannot directly determine whether the voltage or current should be recorded. The energy measurement device 200 can automatically select different circuits or circuit combinations to convert/interpret the sensing voltage Vin by being set in different operating modes (e.g., remote configuration via the control device 140 shown in FIG. 1).

As shown in FIG. 4A, in one embodiment, the conversion circuit 220 is configured to detect the sensing signal which is a voltage type (i.e., using a voltage value to represent a sensing data). In other words, when the energy measurement device 200 is set to a voltage mode, the energy measurement device 200 disable other circuits, and convert the sensing voltage Vin only by the conversion circuit 220 to generate the preset measurement signal S41.

In one embodiment, the voltage mode is a preset mode. In another embodiment, the processing circuit 240 disable other circuits (e.g., the first measurement circuit 230, the second measurement circuit 250) according to a voltage mode signal. In other words, when the conversion circuit 220 directly convert the sensing voltage Vin into the preset measurement signal S41, the first measurement circuit 230 and the second measurement circuit 250 are disabled and in open circuit state, so the sensing voltage Vin will not be affected.

The first measurement circuit 230 is configured to detect the sensing signal which is a current type (i.e., using a current value to represent a sensing data). In other words, when the energy measurement device 200 is set to a current mode, the energy measurement device 200 enables the first measurement circuit 230, and disables other circuits (e.g., disables the second measurement circuit 250).

As shown in FIG. 4B, in one embodiment, the first measurement circuit 230 includes one or more multiple first impedance elements R23-R24. When the first switch T21 receives the first enable signal provided by the processing circuit 240, the sensing voltage Vin forms cross-voltages on the first impedance elements R23-R24 (i.e., convert current characteristics into voltage characteristics to present). The first measurement circuit 230 generates a first measurement voltage S42 according to cross-voltages of the first impedance elements R23-R24. At this time, since a voltage of the input terminal of the conversion circuit 220 will be changed to the first measurement voltage S42 by the first measurement circuit 230, the conversion circuit 220 converts the first measurement voltage S42 to output a first measurement signal S43 to the processing circuit 240.

In the embodiment shown in FIG. 4B, the first measurement circuit 230 includes multiple first impedance elements R23-R24, the first impedance elements R23-R24 are connected in parallel to form multiple shunt currents. Accordingly, the sensing voltage Vin will be prevented from causing damage to the first impedance elements R23-R24 when the sensing voltage Vin has an abnormally high voltage. In addition, electrical stress of the first measurement circuit 230 can be improved. In some other embodiments, the first measurement circuit 230 can only have one impedance element to form the first measurement voltage S42.

As shown in FIGS. 1, 2 and 4C, in one embodiment, the energy measurement device 200 further includes a second measurement circuit 250. The second measurement circuit 250 is coupled to the processing circuit 240 through the conversion circuit 220, and is coupled to the sensor 110 through the input port 210. The second measurement circuit 250 includes a second switch T22. The second switch T22 is coupled between a bias voltage Vd1 and the input terminal of the conversion circuit 220. The turned-on or turned-off state of the first switch T22 is controlled by a control signal Sc2 provided by the processing circuit 240. For example, when the processing circuit 240 transmits a second enable signal to a control terminal of the second switch T22, the second switch T22 will be in a turned-on state. When the processing circuit 240 transmits a second disable signal to the control terminal of the second switch T22, the second switch T22 will be in the turned-off state, and the second measurement circuit 250 will become open (switched to open circuit). In one embodiment, the second switch T22 can be implemented by an N-type or P-type Metal-Oxide-Semiconductor Field-Effect Transistor (MOSFET), but in some other embodiments, it can also be implemented by other transistor switches or switching elements.

The second measurement circuit 250 is configured to detect the sensing signal which is a temperature type (i.e., using temperature to represent a sensing data). "Temperature type" means that the load device/sensor has a thermistor, which can convert the temperature into an impedance value. As shown in FIG. 4C, when detecting the sensing signal of the temperature type, an impedance value of a thermistor R41 of the sensor 110 changes with the temperature of the sensor 110 or the load device. In one embodiment, a temperature coefficient of the thermistor R41 is negative (ie, Negative Temperature Coefficient, hereinafter referred to as NTC). In other words, the higher the temperature, the smaller the impedance value.

When the energy measurement device 200 is set to a temperature mode (NTC mode), the energy measurement device 200 enables the second measurement circuit 250, and disables other circuits (e.g., the first measurement circuit 230).

As mentioned above, when the second switch T22 receives a second enable signal provided by the processing circuit 240, the second measurement circuit 250 is configured to convert the sensing voltage Vin into a second measurement voltage S44. At the same time, the first measurement circuit 230 receives the first disable signal provided by the processing circuit 240, and then the first measurement circuit 230 is disabled and becomes open (switched to open circuit). Since a voltage of the input terminal of the conversion circuit 220 will be changed by the second measurement circuit 250 to the second measurement voltage S44, so the conversion circuit 220 converts the second measurement voltage S44 to output a second measurement signal S45 to the processing circuit 240.

As shown in FIG. 4C, in one embodiment, the second measurement circuit 250 further includes a second impedance element R25. When the second switch T22 receives the second enable signal to enable the second measurement circuit 250, the second measurement circuit 250 uses the second impedance element R25 and the thermistor R41 of the sensor 110 to divide the sensing voltage Vin. A voltage division result will generate the second measurement voltage S44 on the input terminal of the conversion circuit 220. Accordingly, through a voltage dividing characteristics of resistors, "impedance" characteristics will be converted into "voltage" characteristics.

As mentioned above, the energy measurement device 200 can convert the sensing voltage Vin by different circuits or circuit combinations according to different conditions. For example, when the sensing voltage is within the preset voltage range, the energy measurement device 200 converts the sensing voltage Vin by the conversion circuit 220. When the sensing voltage is within the first voltage range, the energy measurement device 200 converts the sensing voltage Vin by the conversion circuit 220 and the first measurement circuit 230. When the sensing voltage is within the second voltage range, the energy measurement device 200 converts the sensing voltage Vin by the conversion circuit 220 and the second measurement circuit 250. Each voltage range is different from each other.

In addition, in one embodiment, the energy measurement device further includes a level shifter 260. The level shifter 260 is coupled to a bias voltage Vd2, the processing circuit 240 and the second switch T22, and is configured to receive a control signal Sc2 (e.g., the second enable signal or the second disable signal) provided by the processing circuit 240. The level shifter 260 is coupled to convert the control signal Sc2 to a suitable voltage level to control the turned-on or turned-off of the second switch T22. Since people in the art can understand the operating principles and changes of the level shifter, and thus they are not further detailed herein.

In the aforementioned embodiments, the energy measurement device 120/200/300 can be set in different modes to selectively convert the sensing voltage Vin by different circuits or circuit combinations. In some other embodiments, the energy measurement device 120/200/300 can have an automatic determination mechanism. To facilitate understanding, here taking three different load devices as examples and illustrate them with FIGS. 1, 2 and 4A-4C. For example, the load device of the energy management system 100 has the following three types:

(1) Industrial motor: the electrical signal used by the industrial motor to record the energy consumption status is "voltage". In an normal operation, the sensing voltage provided by the sensor is between "10-20 volts" (i.e., the preset voltage range). For the industrial motor, the energy measurement device 200 should operate in "voltage mode". That is, other measurement circuits are disabled, and the sensing voltage after conversion will be between "3-6 volts" (i.e., the preset measurement range).

(2) Distribution equipment: the electrical signal used by the distribution equipment to record the energy consumption status is "current". In an normal operation, the sensing current provided by the sensor forms a sensing voltage on the input port 210, and is between "2-5 volts" (i.e., the first voltage range). For the distribution equipment, the energy measurement device 200 should operate in "current mode". That is, the first measurement circuit is enabled, and other measurement circuits are disabled (e.g., disables the second measurement circuit 250), and the sensing voltage after conversion will be between "1-5 volts" (i.e., a first measurement range).

(3) Temperature regulator: the electrical signal used by the temperature regulator to record the energy consumption status is "an impedance value generated by the thermistor". In an normal operation, the sensing voltage provided by the sensor is 0 volt or less than 0.1 volts (i.e., the second voltage range). For the temperature regulator, the energy measurement device 200 should operate in "NTC mode". That is, the second measurement circuit is enabled, and other measurement circuits are disabled, and the sensing voltage after conversion will be between "1-10 volts" (i.e., a second measurement range).

As shown in FIG. 2 and FIGS. 4A-4C, the energy measurement device 200 operates in the voltage mode by default. In other words, when the energy measurement device 200 receives the sensing voltage Vin, the processing circuit 240 first disables other measurement circuits (e.g., the first measurement circuit 230, the second measurement circuit 250). Then, after the conversion circuit 220 converts the sensing voltage Vin into the preset measurement signal S41, the processing circuit 240 determines whether the preset measurement signal S41 exceeds the preset measurement range.

If the preset measurement signal S41 exceeds the preset measurement range (e.g., 8 volts), it means that the sensing voltage Vin received at this time does not correspond to "the industrial motor". At this time, the energy measurement device 200 will be changed to other modes (e.g., the current mode or the NTC mode) to convert the sensing voltage Vin by the first measurement circuit 230 or the second measurement circuit 250. For example, the energy measurement device 200 is changed to the current mode, the processing circuit 240 is configured to enable the first measurement circuit 230, but disables other measurement circuits (e.g., the second measurement circuit 250). Accordingly, by determining whether the signal received by the processing circuit 240 is within each measurement range, the energy measurement device 200 can be able to automatically change to different modes to accurately record the energy consumption data.

The elements, method steps, or technical features in the foregoing embodiments may be combined with each other, and are not limited to the order of the specification description or the order of the drawings in the present disclosure.

It will be apparent to those skilled in the art that various modifications and variations can be made to the structure of the present disclosure without departing from the scope or spirit of the present disclosure. In view of the foregoing, it is intended that the present disclosure cover modifications and variations of this present disclosure provided they fall within the scope of the following claims.

What is claimed is:

1. An energy measurement device, comprising:

a conversion circuit coupled to a processing circuit, and coupled to a sensor through an input port of the energy measurement device to receive a sensing voltage, wherein the conversion circuit is configured to convert the sensing voltage into a preset measurement signal, and provide the preset measurement signal to the processing circuit;

a first measurement circuit coupled to the processing circuit through the conversion circuit, and coupled to the sensor through the input port, wherein the first measurement circuit comprises a first switch, when the first switch receives a first enable signal provided by the processing circuit, the first measurement circuit is configured to convert the sensing voltage into a first measurement voltage, and the conversion circuit is configured to convert the first measurement voltage into a first measurement signal; and a second measurement circuit coupled to the processing circuit through the conversion circuit, and coupled to the sensor through the input port, wherein the second measurement circuit comprises a second switch, when the second switch receives a second enable signal provided by the processing circuit, the second measurement circuit is configured to convert the sensing voltage into a second measurement voltage, and the conversion circuit is configured to convert the second measurement voltage into a second measurement signal; and wherein when the second switch receives a second disable signal provided by the processing circuit, the second measurement circuit is switched to open.

2. The energy measurement device of claim 1, wherein the first measurement circuit further comprises a first impedance element, when the first switch receives the first enable signal, the first measurement circuit generates the first measurement voltage according to a cross-voltage of the first impedance element; when the first switch receives a first disable signal provided by the processing circuit, the first measurement circuit becomes open.

3. The energy measurement device of claim 1, wherein when the conversion circuit converts the sensing voltage into the preset measurement signal, the first measurement circuit and the second measurement circuit are disabled.

4. The energy measurement device of claim 3, wherein the second measurement circuit further comprises a second impedance element, when the second switch receives the second enable signal, the second measurement circuit divides the sensing voltage according to the second impedance element and a thermistor of the sensor to generate the second measurement voltage.

5. The energy measurement device of claim 1, wherein the conversion circuit comprises:

a voltage limiting element coupled to the input port;

a plurality of voltage dividing resistors coupled to the voltage limiting element; and a filter capacitor coupled between the plurality of voltage dividing resistors and the processing circuit.

6. An energy measurement device, comprising;

a processing circuit;

a conversion circuit coupled to the processing circuit, and coupled to a sensor through an input port of the energy measurement device to receive a sensing voltage; and a first measurement circuit coupled to the processing circuit through the conversion circuit, and coupled to the sensor through the input port;

wherein when the processing circuit disables the first measurement circuit, the conversion circuit is configured to convert the sensing voltage into a preset measurement signal, and provide the preset measurement signal to the processing circuit;

wherein when the processing circuit enables the first measurement circuit, the first measurement circuit is configured to convert the sensing voltage into a first measurement voltage, and the conversion circuit is configured to convert the first measurement voltage into a first measurement signal.

7. The energy measurement device of claim 6, wherein when the energy measurement device receives the sensing voltage, the processing circuit first disables the first measurement circuit, and determines whether the preset measurement signal provided by the conversion circuit exceeds a preset measurement range;

wherein when the preset measurement signal exceeds the preset measurement range, the processing circuit is configured to enable the first measurement circuit.

8. The energy measurement device of claim 6, wherein the first measurement circuit further comprises a first impedance element and a first switch, when the first switch receives a first enable signal provided by the processing circuit, the first measurement circuit generates the first measurement voltage according to a cross-voltage of the first impedance element; when the first switch receives a first disable signal provided by the processing circuit, the first measurement circuit becomes open.

9. The energy measurement device of claim 6, further comprising:

a second measurement circuit coupled to the processing circuit through the conversion circuit, and coupled to the sensor through the input port, wherein the second measurement circuit comprises a second switch, when the second switch receives a second enable signal provided by the processing circuit, the second measurement circuit is configured to convert the sensing voltage into a second measurement voltage, and the conversion circuit is configured to convert the second measurement voltage into a second measurement signal; and wherein when the second switch receives a second disable signal provided by the processing circuit, the second measurement circuit is switched to open.

10. The energy measurement device of claim 9, wherein the processing circuit is configured to disable the first measurement circuit and the second measurement circuit according to a voltage mode signal, so that the conversion circuit converts the sensing voltage into the preset measurement signal.

11. The energy measurement device of claim 10, wherein the second measurement circuit further comprises a second impedance element, when the second switch receives the second enable signal, the second measurement circuit divides the sensing voltage according to the second impedance element and a thermistor of the sensor to generate the second measurement voltage.

12. The energy measurement device of claim 6, wherein the conversion circuit comprises:

a voltage limiting element coupled to the input port;

a plurality of voltage dividing resistors coupled to the voltage limiting element; and a filter capacitor coupled between the plurality of voltage dividing resistors and the processing circuit.

13. An energy measurement device, comprising;

a processor;

a plurality of input ports coupled to a plurality of sensors; and a plurality of energy measurement circuits, wherein each of the plurality of energy measurement circuits is respectively coupled to one of the plurality of input ports, and comprises:

a conversion circuit coupled to the processor, and coupled to a corresponding one of the plurality of input ports to receive a sensing voltage of a corresponding one of the plurality of sensors, wherein when the sensing voltage is within a preset voltage range, the conversion circuit is configured to convert the sensing voltage into a preset measurement signal; and a first measurement circuit coupled to the processor through the conversion circuit, and coupled to the corresponding one of the plurality of input ports, wherein when the sensing voltage is within a first voltage range, the first measurement circuit is enabled by the processor, is configured to convert the sensing voltage into a first measurement voltage, and the conversion circuit is configured to convert the first measurement voltage into a first measurement signal.

14. The energy measurement device of claim 13, wherein when one of the plurality of energy measurement circuits receives the sensing voltage, the processor first disables the first measurement circuit, and determines whether the preset measurement signal provided by the conversion circuit exceeds a preset measurement range;

wherein when the preset measurement signal exceeds the preset measurement range, the processor is configured to enable the first measurement circuit.

15. The energy measurement device of claim 13, wherein the first measurement circuit further comprises a first impedance element and a first switch, when the first switch receives a first enable signal provided by the processor, the first measurement circuit generates the first measurement voltage according to a cross-voltage of the first impedance element; when the first switch receives a first disable signal provided by the processor, the first measurement circuit becomes open.

16. The energy measurement device of claim 13, further comprising:

a second measurement circuit coupled to the processor through the conversion circuit, and coupled to the corresponding one of the plurality of input ports, wherein the second measurement circuit comprises a second switch, when the sensing voltage is within a second voltage range, the second switch receives a second enable signal provided by the processor, the second measurement circuit is configured to convert the sensing voltage into a second measurement voltage, and the conversion circuit is configured to convert the second measurement voltage into a second measurement signal; and wherein the second voltage range is different from the first voltage range.

17. The energy measurement device of claim 16, wherein the processor is configured to disable the first measurement circuit and the second measurement circuit according to a voltage mode signal, so that the conversion circuit converts the sensing voltage into the preset measurement signal; and wherein when the processor provides the second enable signal to the second switch, the processor disables the first measurement circuit.

18. The energy measurement device of claim 17, wherein the second measurement circuit further comprises a second impedance element, when the second switch receives the second enable signal, the second measurement circuit divides the sensing voltage according to the second impedance element and a thermistor to generate the second measurement voltage; and wherein when the second switch receives a second disable signal provided by the processor, the second measurement circuit becomes open.

19. The energy measurement device of claim 13, wherein the conversion circuit comprises:

a voltage limiting element;

a plurality of voltage dividing resistors coupled to the voltage limiting element; and a filter capacitor coupled between the plurality of voltage dividing resistors and the processor.

* * * * *